(12) United States Patent
Tanaka

(10) Patent No.: US 7,075,851 B2
(45) Date of Patent: Jul. 11, 2006

(54) SEMICONDUCTOR MEMORY DEVICE INPUTTING/OUTPUTTING DATA AND PARITY DATA IN BURST OPERATION

(75) Inventor: Shinji Tanaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 265 days.

(21) Appl. No.: 10/682,153

(22) Filed: Oct. 10, 2003

(65) Prior Publication Data

US 2004/0160853 A1 Aug. 19, 2004

(30) Foreign Application Priority Data

Feb. 17, 2003 (JP) ......................................... 2003-037716

(51) Int. Cl.
*G11C 8/00* (2006.01)

(52) U.S. Cl. .................... 365/230.06; 365/233

(58) Field of Classification Search ............ 365/189.01, 365/189.05, 189.08, 230.06, 230.08, 233
See application file for complete search history.

(56) References Cited

U.S. PATENT DOCUMENTS 5,002,031 A * 3/1991 Kako .......................... 123/486
5,604,703 A * 2/1997 Nagashima .................. 365/200
5,905,673 A * 5/1999 Khan ...................... 365/185.03
6,269,048 B1 * 7/2001 Kano et al. .................. 365/233
6,510,537 B1 * 1/2003 Lee ............................ 714/763
6,717,879 B1 * 4/2004 Tanaka ........................ 365/222

FOREIGN PATENT DOCUMENTS

JP          11-65944      3/1999
TW          479170        3/2002

* cited by examiner

Primary Examiner—Son T. Dinh
Assistant Examiner—Hien Nguyen
(74) Attorney, Agent, or Firm—McDermott Will & Emery LLP (57) ABSTRACT

A control circuit controls a column decoder and a parity column decoder such that parity data is input/output to a memory cell array at a timing different from that of input/output of data corresponding to the parity data to/from the memory cell array. Therefore, a terminal for parity data input/output is not necessary, and a memory device can be adapted to an ECC function without increasing a memory bus width.

7 Claims, 7 Drawing Sheets

SEMICONDUCTOR MEMORY DEVICE INPUTTING/OUTPUTTING DATA AND PARITY DATA IN BURST OPERATION

BACKGROUND OF THE INVENTION

1. Field of the Invention

The present invention relates to a semiconductor memory device adapted to an ECC (Error Checking and Correcting) function, and more particularly to a semiconductor memory device in which a memory bus width can be reduced, as well as a controller controlling the same.

2. Description of the Background Art

Recently, a processing speed of a computer has remarkably been enhanced, and accordingly, a function to improve reliability of the computer has been required. The ECC function is one example of such function. In the computer of which high reliability is demanded, a memory device adapted to the ECC function is employed as a main memory in many cases. Therefore, even if an error occurs, the error can be corrected using parity data.

For example, if 8-bit parity data is added to original data of 64 bits, an error of arbitrary 1 bit among 72 bits can be corrected, and an error of 2 or more bits can be detected.

An invention disclosed in Japanese Patent Laying-Open No. 11-65944 relates to such technology. A data error detecting circuit disclosed in Japanese Patent Laying-Open No. 11-65944 includes k ECC circuits with a function to detect n-bit burst error, and is configured such that m-bit data output from each memory element is divided into k pieces, which are in turn input to separate, k ECC circuits. In this manner, even if the number of output bits of the memory element constituting a memory device increases, a defect that occurred in the memory element can be detected by means of the ECC circuit which is used when the number of output bits of the memory element is small.

On the other hand, though the data error detecting circuit disclosed in Japanese Patent Laying-Open No. 11-65944 described above can adapt to an increase in the number of output bits of the memory element, the memory bus width itself cannot be reduced. That is, if the ECC function is added to the system, the memory bus width is increased. Therefore, it is difficult to add the ECC function to a compact system.

SUMMARY OF THE INVENTION

An object of the present invention is to provide a semiconductor memory device adapted to the ECC function without increasing a memory bus width.

Another object of the present invention is to provide a controller controlling a semiconductor memory device adapted to the ECC function without increasing a memory bus width.

According to one aspect of the present invention, a semiconductor memory device inputs/outputs data in a burst operation. The semiconductor memory device includes a memory cell array having a plurality of memory cells; a row decoder decoding a row address; a first column decoder decoding a column address; a second column decoder decoding a column address for parity; and a control unit controlling the first column decoder and the second column decoder, such that parity data is input/output to the memory cell array at a timing different from that of input/output of data corresponding to the parity data to the memory cell array.

The control unit controls the first column decoder and the second column decoder, such that the parity data is input/output to the memory cell array at a timing different from that of input/output of the data corresponding to the parity data to the memory cell array. Therefore, a terminal for parity data input/output is not necessary, and the semiconductor memory device can be adapted to the ECC function without increasing the memory bus width.

According to another aspect of the present invention, a controller controls a semiconductor memory device inputting/outputting data in a burst operation. The controller includes a buffer holding parity data input/output to the semiconductor memory device, and shifting the parity data by a prescribed bit unit; an operation unit calculating parity data for data written in a prescribed number of burst operations with respect to the semiconductor memory device to sequentially store the parity data in the buffer by a prescribed bit unit, and sequentially reading parity data from the buffer by a prescribed bit unit in accordance with data read in the prescribed number of burst operations with respect to the semiconductor memory device, to correct an error; and a switching unit controlling input/output of the parity data to the buffer.

The operation unit calculates the parity data for the data written in the prescribed number of burst operations with respect to the semiconductor memory device, to sequentially store the parity data in the buffer by a prescribed bit unit, and sequentially reads the parity data from the buffer by the prescribed bit unit in accordance with the data read in the prescribed number of burst operations with respect to the semiconductor memory device, to correct an error. Therefore, the semiconductor memory device adapted to the ECC function without increasing a memory bus width can be controlled.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
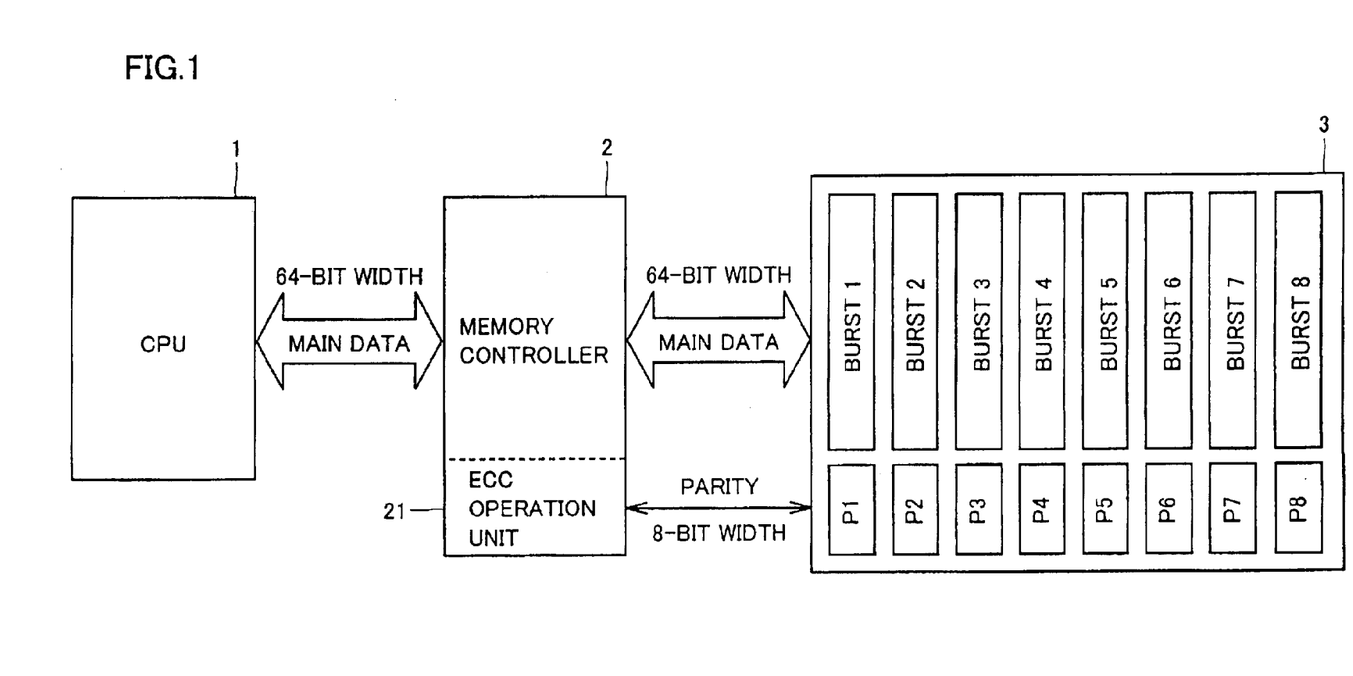
FIG. 1 shows one example of a system with an ECC function.

FIG. 1 shows one example of a system with the ECC function. This system includes a CPU (Central Processing Unit) 1, a memory controller 2 with an ECC operation function, and a memory 3. A data bus (main data) between CPU 1 and memory controller 2 has a width of 64 bits. A memory bus between memory controller 2 and memory 3 has a width of 72 bits (64 bits for main data, and 8 bits for parity data).

Memory controller 2 includes an ECC operation unit 21. In data writing, ECC operation unit 21 performs operation of 8-bit parity data from main data of 64 bits output from CPU 1. Then, memory controller 2 outputs 64-bit main data and 8-bit parity data to memory 3.

In addition, in data reading, ECC operation unit 21 detects an error, using the 64-bit main data and 8-bit parity data read from memory 3. If an error occurs, ECC operation unit 21 corrects the error, and outputs 64-bit main data to CPU 1.

Figure 2:
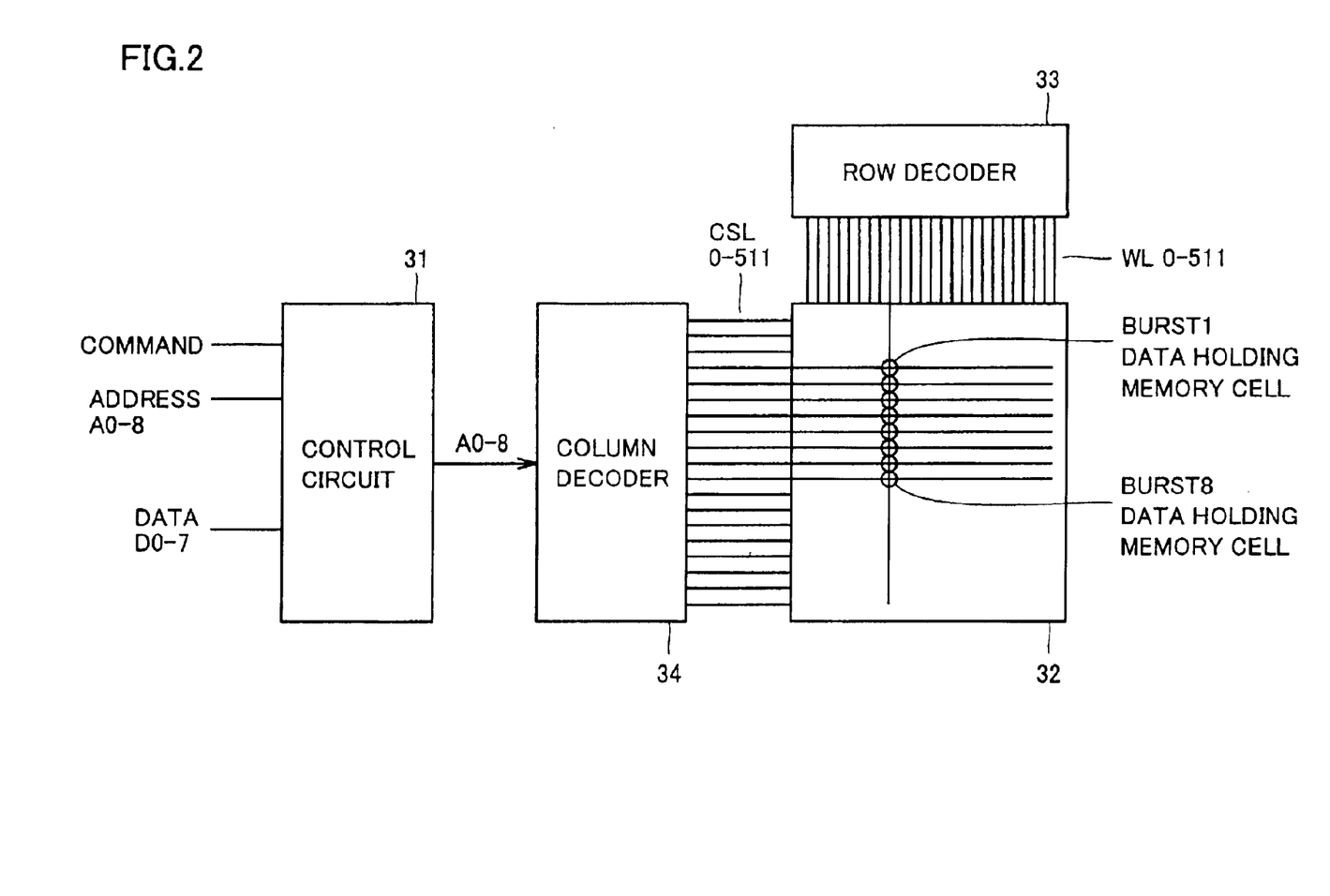
FIG. 2 shows a configuration of an SDRAM, which is one example of a memory 3.

FIG. 2 shows a configuration of an SDRAM (Synchronous Dynamic Random Access Memory) which is one example of memory 3. The SDRAM attains a function to successively input/output a plurality of successive pieces of data, which is called a "burst operation". The SDRAM is constituted with a memory module equipped with 8 memory devices including an 8-bit DQ (data input/output) terminal and a 1-bit parity input/output terminal. FIG. 2 shows a memory device to which data D0–7 is input/output.

As shown in FIG. 2, an SDRAM 3 includes a control circuit 31 receiving a command from memory controller 2 and performing overall control of SDRAM 3, a memory cell array 32, a row decoder 33, and a column decoder 34. Row decoder 33 activates any of word lines (WL) 0 to 511, upon receiving a row address from control circuit 31. Column decoder 34 activates any of common source lines (CSL) 0 to 511, upon receiving a column address from control circuit 31.

Here, writing/reading to/from a memory cell selected by row decoder 33 and column decoder 34 is permitted. To this memory device, 512-bit main data and 64-bit parity data are written/read in 8 burst operations.

In the system shown in FIG. 1, 8-bit parity data is added to 64-bit main data. Therefore, the bus width is increased to 72 bits, which makes it difficult to adopt this configuration in a compact system. A system solving this problem will be described in the following.

Figure 3:
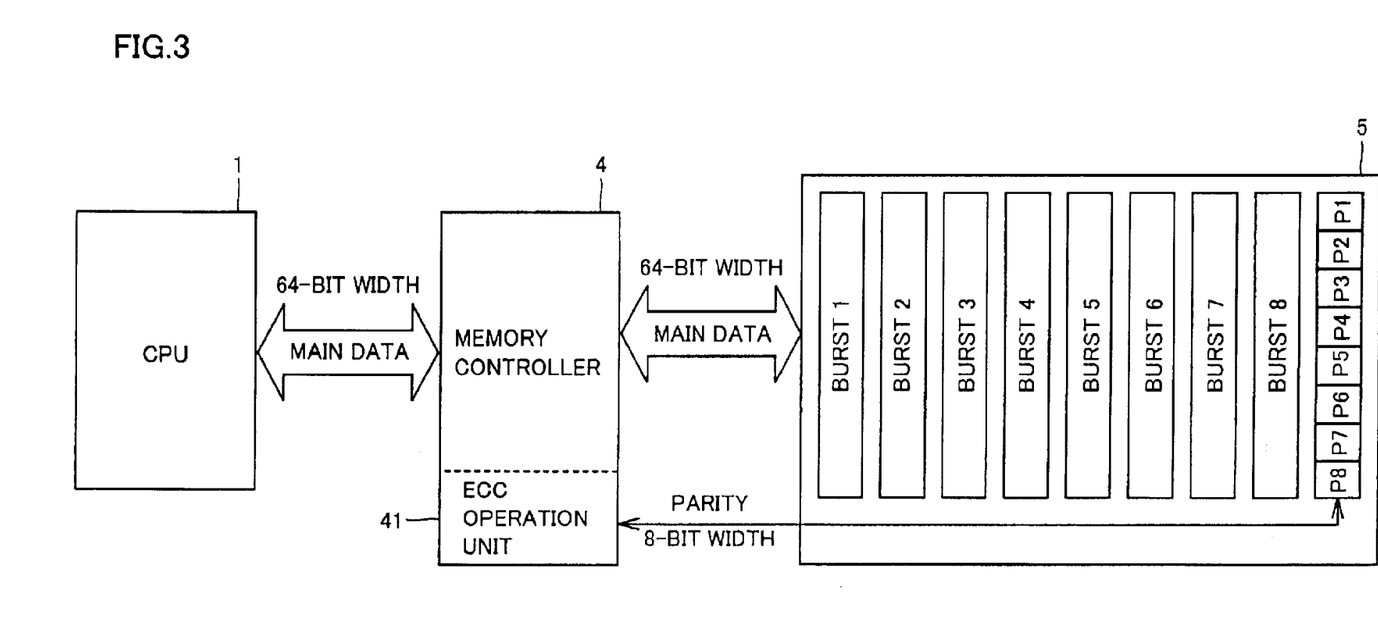
FIG. 3 shows one example of a system with the ECC function in an embodiment of the present invention.

FIG. 3 shows one example of a system with the ECC function in the embodiment of the present invention. This system includes CPU 1, a memory controller 4 with the ECC operation function, and a memory 5. A data bus (main data) between CPU 1 and memory controller 4 has a width of 64 bits. A memory bus between memory controller 4 and memory 5 also has a width of 64 bits.

Figure 4:
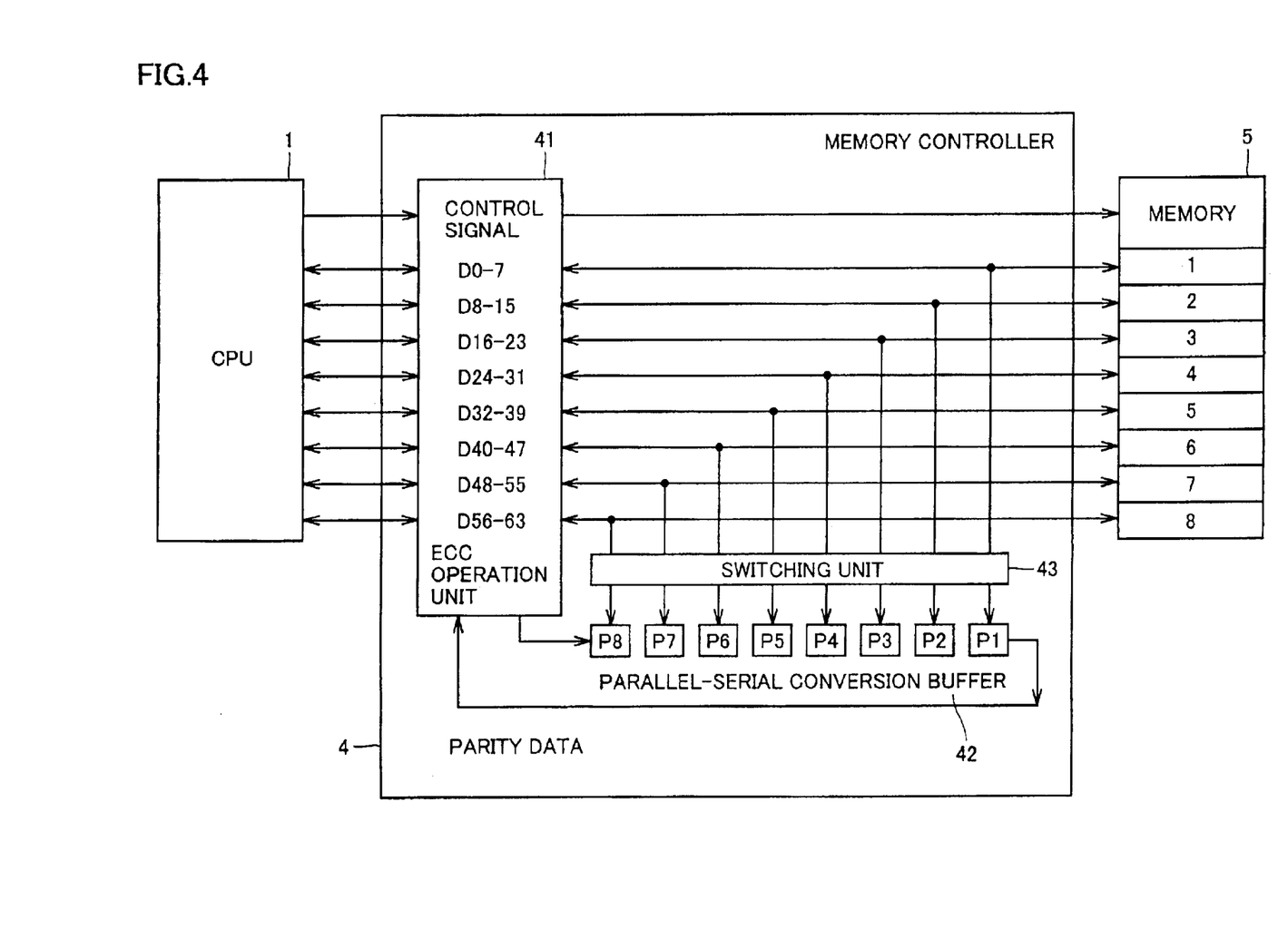
FIG. 4 is a block diagram showing a schematic configuration of a memory controller 4 in the embodiment of the present invention.

FIG. 4 is a block diagram showing a schematic configuration of memory controller 4 in the embodiment of the present invention. Memory controller 4 includes an ECC operation unit 41 with the ECC operation function, controlling input/output of data by outputting a control signal to memory 5, a switching unit 43 controlling switching of data D0–63, and a parallel-serial conversion buffer 42 (hereinafter, abbreviated as a "P/S conversion buffer") converting parallel data to serial data.

In memory controller 4, 64-bit memory bus is divided into 8 groups of 8 bits each. While CPU 1 is writing data to memory 5 in a burst, switching unit 43 is rendered nonconductive, and 8-bit parity data calculated by ECC operation unit 41 is sequentially stored in P/S conversion buffer 42, which is in turn shifted by a unit of 8 bits. When CPU 1 completes data writing to memory 5, switching unit 43 is rendered conductive, and 64-bit parity data is output to memory 5.

When 64-bit parity data is being output from memory 5, switching unit 43 is rendered conductive, and 64-bit parity data is stored in P/S conversion buffer 42 by a unit of 8 bits. While CPU 1 is reading data from memory 5 in a burst, ECC operation unit 41 detects and corrects an error, referring to 8-bit parity data output from P/S conversion buffer 42. Details of an operation of memory controller 4 will be described later.

Figure 5:
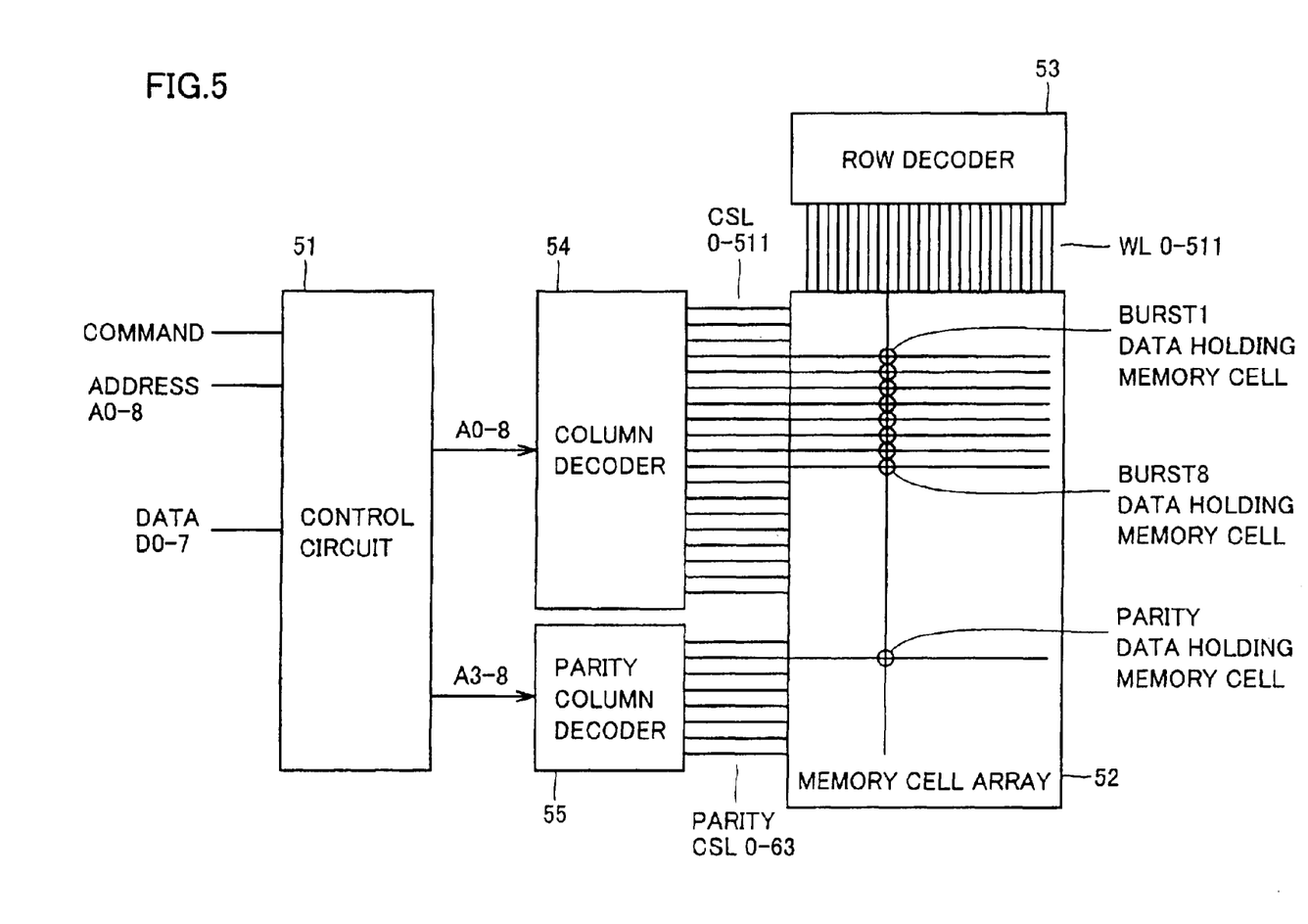
FIG. 5 shows a schematic configuration of the SDRAM, which is one example of a memory 5 in the embodiment of the present invention.

FIG. 5 shows a schematic configuration of an SDRAM which is one example of memory 5 in the embodiment of the present invention. An SDRAM 5 has a burst function, and operates in synchronization with a clock. The SDRAM is constituted with a memory module equipped with 8 memory devices including an 8-bit DQ (data input/output) terminal. FIG. 5 shows a memory device to which data D0–7 is input/output.

As shown in FIG. 5, SDRAM 5 includes a control circuit 51 receiving a command from memory controller 4 and performing overall control of SDRAM 5, a memory cell array 52, a row decoder 53, a column decoder 54, and a parity column decoder 55. Row decoder 53 activates any of word lines (W1) 0 to 511, upon receiving a row address from control circuit 51.

Column decoder 54 activates any of CSL 0 to 511, upon receiving a column address (A0-8) from control circuit 51. Parity column decoder 55 activates any of parity CSL 0 to 63, upon receiving a parity column address (A3–8) from control circuit 51.

Here, data writing/reading to/from a memory cell selected by row decoder 53 and column decoder 54 is permitted. To/from this memory device, 512-bit main data and 64-bit parity data are written/read in 8 burst operations. In addition, writing/reading of parity to/from a memory cell selected by row decoder 53 and column decoder 54 is permitted.

In SDRAM 5, when CPU 1 writes data in a burst, 64-bit parity data is written after burst writing of 8 times is completed. When CPU 1 reads data in a burst, SDRAM 5 first outputs 64-bit parity data, and thereafter, burst reading of 8 times is performed.

Figure 6:
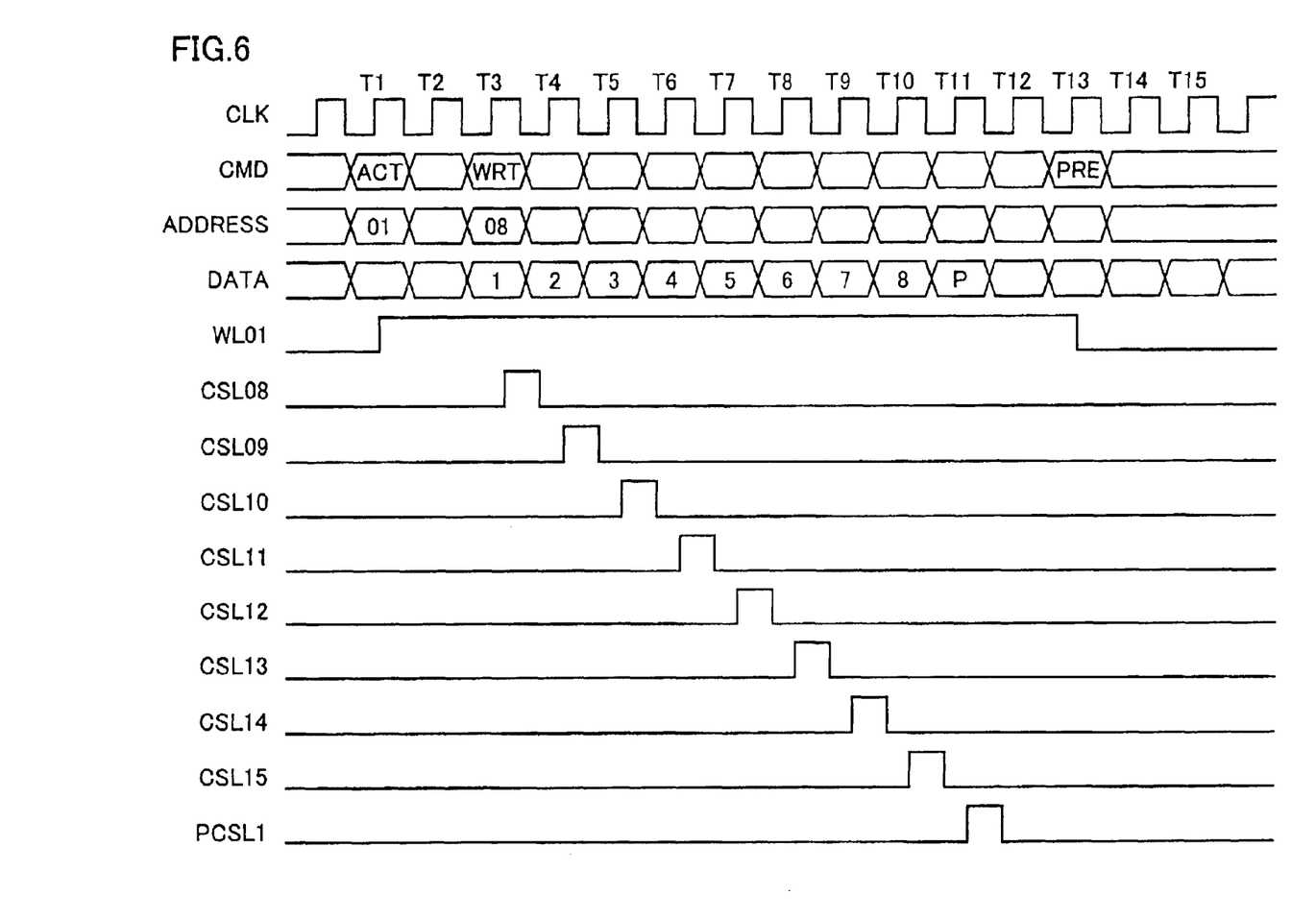
FIG. 6 is a timing chart illustrating a writing operation of SDRAM 5.

FIG. 6 is a timing chart illustrating a writing operation of SDRAM 5. The writing operation of memory controller 4 and SDRAM 5 will be described with reference to this timing chart.

First, when control circuit 51 receives an activation (ACT) command and a row address "01" from memory controller 4, row decoder 53 activates WL01 (T1).

Next, when controller 51 receives a write (WRT) command, a column address "08", and write data (64-bit data corresponding to burst 1) from memory controller 4, column decoder 54 activates CSL08, and writing operation to memory cell array 52 is performed (T3). Here, ECC operation unit 41 calculates 8-bit parity data, which is in turn written into P/S conversion buffer (P8) 42.

Thereafter, CSL09–15 are sequentially activated in synchronization with the clock, and burst writing (burst 2 to 8) is performed (T4 to T10). During this period, ECC operation unit 41 calculates 8-bit parity data 7 times, which is in turn sequentially written into P/S conversion buffer 42, and shifted. At T10, 64-bit parity data is completely written in P/S conversion buffer 42.

Next, when parity column decoder 55 activates PCSL1, 64-bit parity data output from memory controller 4 is written in memory cell array 52 (T11). Here, switching unit 43 is rendered conductive, and 64-bit parity data stored in P/S conversion buffer 42 is output to D0 to D63.

Finally, when control circuit 51 receives a precharge (PRE) command from memory controller 4, row decoder 53 inactivates WL01, and precharge is performed (T13).

Figure 7:
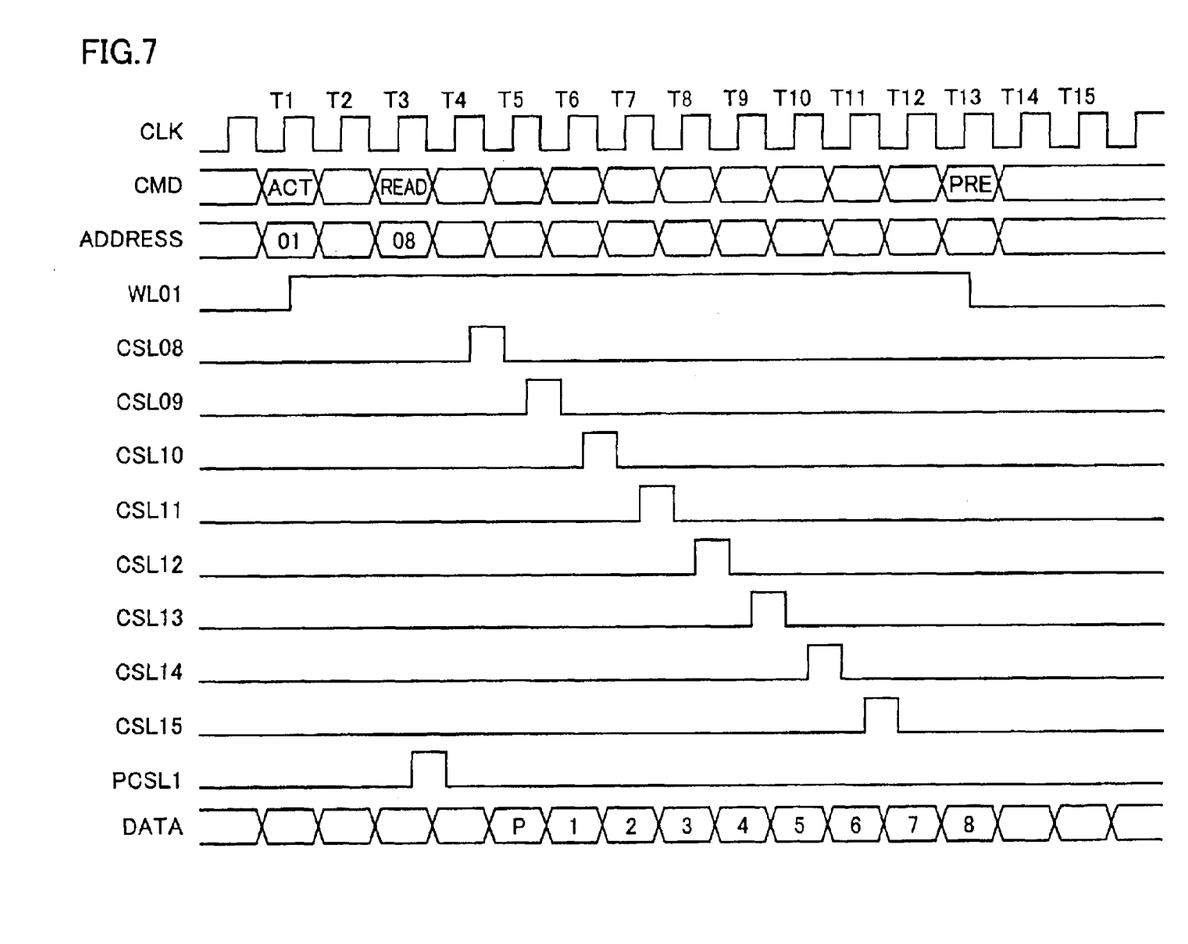
FIG. 7 is a timing chart illustrating a reading operation of SDRAM 5.

FIG. 7 is a timing chart illustrating a reading operation of SDRAM 5. The reading operation of memory controller 4 and SDRAM 5 will be described with reference to this timing chart.

First, when control circuit 51 receives the activation (ACT) command and the row address "01" from memory controller 4, row decoder 53 activates WL01 (T1).

Next, when control circuit 51 receives a read (READ) command and column address "08" from memory controller 4, parity column decoder 55 activates PCSL01, and reads 64-bit parity data from memory cell array 52 (T3). Here, switching unit 43 is rendered conductive, and 64-bit parity data is written in P/S conversion buffer 42.

Next, column decoder 54 activates CSL08, and 64-bit data (data corresponding to burst 1) is read from memory cell array 52 (T4). Here, switching unit 43 is rendered non-conductive, and ECC operation unit 41 detects and corrects an error in 64-bit data output from SDRAM 5, referring to 8-bit parity data output from P/S conversion buffer 42.

Thereafter, CSL09-15 are sequentially activated in synchronization with the clock, and burst reading (burst 2 to 8) is performed (T5 to T11). During this period, ECC operation unit 41 sequentially detects and corrects an error in 64-bit data 7 times, which is output from SDRAM 5, referring to 8-bit parity data sequentially output from P/S conversion buffer 42.

Finally, when control circuit 51 receives the precharge (PRE) command from memory controller 4, row decoder 53 inactivates WL01, and precharge is performed (T13).

As described above, according to memory 5 in the present embodiment, in data writing, 64-bit parity data is written after 64-bit burst writing of 8 times is completed, while in data reading, 64-bit parity data is first read, and thereafter, 64-bit burst reading is performed 8 times. Therefore, a memory device can adapt to the ECC function without increasing the memory bus width.

In addition, according to memory controller 4 in the present embodiment, in data writing, 8-bit parity data is sequentially calculated 8 times during 64-bit burst writing of 8 times, and 64-bit parity data is output after the burst writing is completed. On the other hand, in data reading, 64-bit parity data is first stored in P/S conversion buffer 42, and thereafter, an error is sequentially detected and corrected during 64-bit burst reading of 8 times. Thus, memory 5 attaining an effect as above can be controlled.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device inputting/outputting data in a burst operation, comprising:
   a memory cell array having a plurality of memory cells;
   a row decoder decoding a row address;
   a first column decoder decoding a column address;
   a second column decoder decoding a column address for parity; and
   a control unit controlling said first column decoder and said second column decoder, such that parity data is input/output to/from said memory cell array at a timing different from that of input/output of data corresponding to/from said parity data to said memory cell array.

2. The semiconductor memory device according to claim 1, wherein
   said control unit controls said first column decoder so as to control writing of data in a prescribed number of burst operations, and thereafter, controls said second column decoder so as to control writing of parity data corresponding to said data.

3. The semiconductor memory device according to claim 1, wherein
   said control unit controls said second column decoder so as to control reading of parity data, and thereafter, controls said first column decoder so as to control reading of data corresponding to said parity data in a prescribed number of burst operations.

4. The semiconductor memory device according to claim 1, wherein
   said second column decoder decodes a portion of an address decoded by said first column decoder.

5. A controller controlling a semiconductor memory device inputting/outputting data in a burst operation, comprising:
   a buffer holding parity data input/output to/from said semiconductor memory device, and shifting the parity data by a prescribed bit unit;
   an operation unit calculating parity data for data written in a prescribed number of burst operations with respect to said semiconductor memory device, to sequentially store the parity data in said buffer by a prescribed bit unit, and sequentially reading parity data from said buffer by the prescribed bit unit in accordance with data read in the prescribed number of burst operations with respect to said semiconductor memory device, to correct an error; and
   a switching unit controlling input/output of the parity data to/from said buffer.

6. The controller according to claim 5, wherein
   said switching unit outputs parity data corresponding to the data stored in said buffer, after burst writing of the prescribed number of times with respect to said semiconductor memory device is completed.

7. The controller according to claim 5, wherein
   said switching unit outputs parity data corresponding to the data to said buffer, before burst reading of the prescribed number of times with respect to said semiconductor memory device is performed.

* * * * *